US008223568B2

(12) United States Patent
Seo (10) Patent No.: US 8,223,568 B2
(45) Date of Patent: Jul. 17, 2012

(54) SEMICONDUCTOR MEMORY DEVICE ADOPTING IMPROVED LOCAL INPUT/OUTPUT LINE PRECHARGING SCHEME

(75) Inventor: Seong-Young Seo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 292 days.

(21) Appl. No.: 12/588,535

(22) Filed: Oct. 19, 2009

(65) Prior Publication Data
US 2010/0157702 A1 Jun. 24, 2010

(30) Foreign Application Priority Data
Dec. 19, 2008 (KR) .................. 10-2008-0129775

(51) Int. Cl.
*G11C 7/12* (2006.01)
(52) U.S. Cl. ........................ 365/203; 365/194
(58) Field of Classification Search .................. 365/149, 365/189.15, 194, 190, 203
See application file for complete search history.

(56) References Cited

U.S. PATENT DOCUMENTS

| 5,155,702 | A | * | 10/1992 | Min .................... 365/189.011 |
| 5,327,394 | A | * | 7/1994 | Green et al. .............. 365/233.5 |
| 5,559,752 | A | * | 9/1996 | Stephens et al. ........... 365/233.1 |
| 5,677,886 | A | * | 10/1997 | Seo et al. ................. 365/203 |
| 5,710,738 | A | * | 1/1998 | Tai ........................ 365/203 |
| 6,031,769 | A | * | 2/2000 | Kim ....................... 365/194 |
| 6,205,068 | B1 | * | 3/2001 | Yoon ...................... 365/203 |
| 6,336,215 | B1 | * | 1/2002 | Oberhauser et al. ......... 717/129 |
| 2002/0167859 | A1 | * | 11/2002 | Chun ...................... 365/233 |
| 2005/0146957 | A1 | * | 7/2005 | Lee et al. ................. 365/203 |
| 2010/0097839 | A1 | * | 4/2010 | Kim ....................... 365/145 |

FOREIGN PATENT DOCUMENTS

| KR | 10-0720260 | 5/2007 |
| KR | 10-0763253 | 9/2007 |
| KR | 10-2008-0051836 | 6/2008 |

OTHER PUBLICATIONS

An English language abstract of Korean Publication No. KR 10-0720260, published May 23, 2006.

* cited by examiner

*Primary Examiner* — Douglas King
(74) *Attorney, Agent, or Firm* — Harness, Dickey & Pierce (57) ABSTRACT

A semiconductor memory device capable of preventing or minimizing bit line disturbance and performing a low-voltage high-speed operation includes a read data path circuit including a bit line sense amplifier, a local input/output line sense amplifier, a column selecting unit to operationally connect bit lines connected to the bit line sense amplifier to local input/output lines connected to the local input/output line sense amplifier in response to a column selection signal, and a local input/output line precharging unit to precharge the pair of local input/output lines by a first precharging unit, equalizing the pair of local input/output lines by an equalizing unit, and to precharge the local input/output lines by a second precharging unit following an elapsed time after the bit line sense amplifier is activated, while the column selection is deactivated.

16 Claims, 9 Drawing Sheets

SEMICONDUCTOR MEMORY DEVICE ADOPTING IMPROVED LOCAL INPUT/OUTPUT LINE PRECHARGING SCHEME

PRIORITY STATEMENT

This U.S. non-provisional patent application claims Priority Under 356 U.S.C. §119 to Korean Patent Application 10-2008-0129775, filed on Dec. 19, 2008, in the Korean Intellectual Property Office (KIPO), the entire contents of which are incorporated herein by reference.

BACKGROUND

1. Field

Example embodiments of the present invention relate to a semiconductor memory device, and in particular, to a read data path circuit for use in a semiconductor integrated circuit device such as a dynamic random access memory.

2. Description of the Related Art

Figure 1:
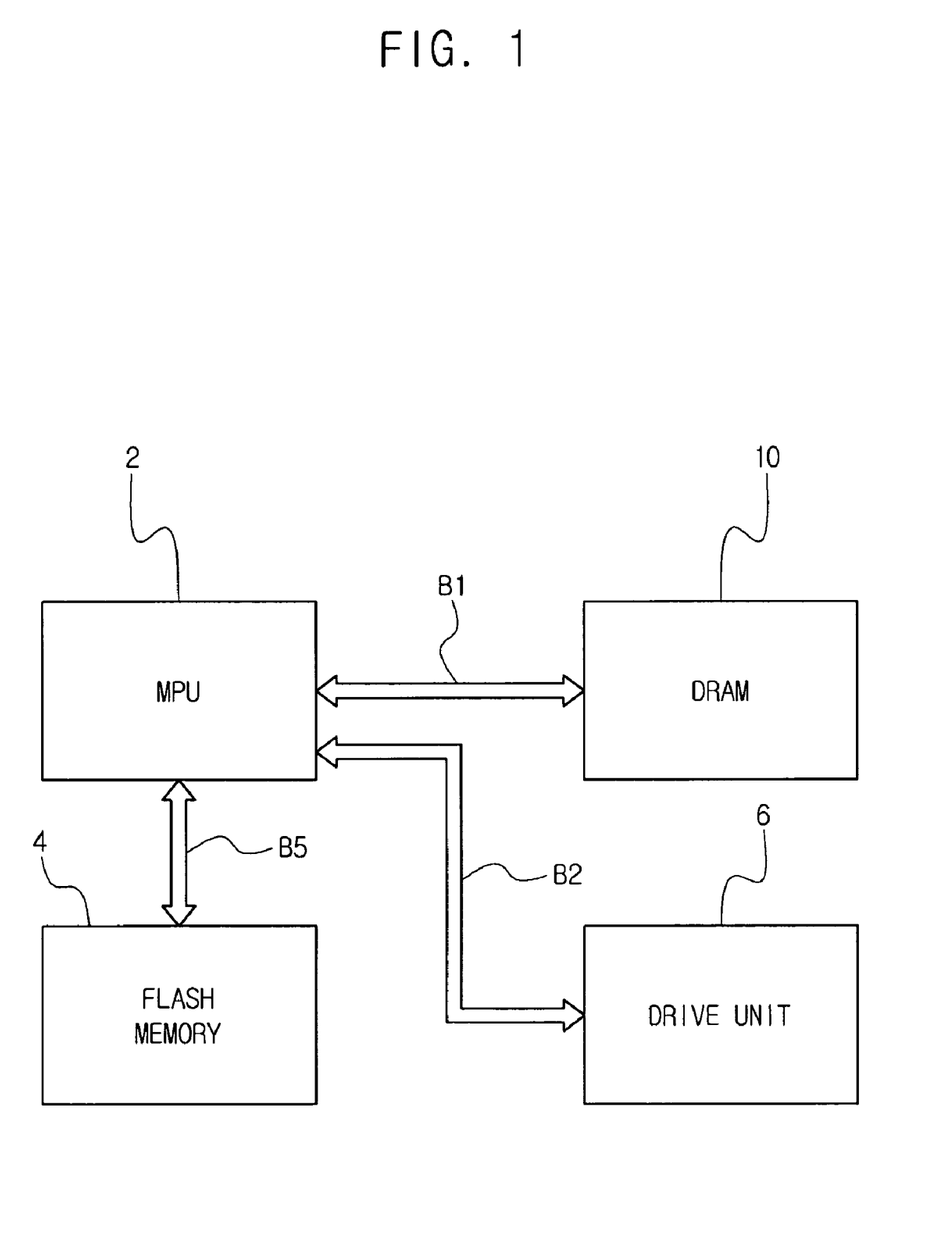
FIG. 1 is a block diagram illustrating a configuration of a general data processing system.

There is a movement towards developing semiconductor memory devices including dynamic random access memories (hereinafter, referred to as DRAMs) with a high degree of integration and high speed. DRAMs have memory cells and are generally adopted as main memories for electronic systems. Each of the memory cells includes one access transistor and one storage capacitor Referring to FIG. 1, in a general data processing system, a DRAM 10 adopted as a main memory is connected to a micro processing unit 2 through a system bus B1. The micro processing unit 2 is connected to a flash memory 4 through a system bus B5, performs a processing operation set in accordance with a program stored in the flash memory 4, and controls a drive unit 6 through a control bus B2 as occasion demands. In order to perform a processing operation for controlling the drive unit 6, the micro processing unit 2 performs a data accessing operation to write data in memory cells of the DRAM 10 and read data from memory cells.

During a read operation, data stored in memory cells of the DRAM 10 are transmitted to pairs of bit lines and are sensed and amplified by bit line sense amplifiers (hereinafter, referred to as BLSAs). Then, when a column selection line signal is activated, the data is transmitted to pairs of local input/output lines. Sequentially, the data is provided to data output buffers through corresponding global input/output lines and then output to the external of the semiconductor memory device.

In the DRAM 10, bit lines and local input/output lines which are not involved in the read operation are generally precharged to a voltage so as to increase a sensing speed and to prevent them from being floated. Pairs of local input/output lines are precharged to a voltage which corresponds to half of a source voltage or an operation voltage of a memory cell array. In other words, pairs of local input/output lines are precharged to a voltage equal to a precharge voltage for the bit lines. The operation voltage of the memory cell array generally is slightly less than or equal to the source voltage.

If a pair of local input/output lines are connected to local input/output line sense amplifiers, in order to increase the sensing speed of the local input/output line sense amplifiers, a technique for varying a precharge voltage for a pair of local input/output lines in accordance with an operation mode is applicable. For example, when a pair of local input/output lines are maximally amplified to have the operation voltage and a ground voltage, and are precharged to a first voltage, the precharging of the pair of local input/output lines may cause noise to change the level of the first voltage. In other words, the noise may influence a circuit which generates the first voltage, resulting in a drop in efficiency in sensing data from memory cells. In this case, the above-mentioned precharging technique may be applicable.

Until an active mode, for example, a read or write operation on memory cells starts, the pair of local input/output lines are precharged to the voltage equal to the precharge voltage for the bit lines. When a word line is enabled to enter an active mode, the pair of local input/output lines are precharged to a voltage equal to the operation voltage of the cell array. When the active mode is ended, the pair of local input/output lines are precharged to the voltage equal to the precharge voltage for the bit lines again.

A general precharging circuit to precharge a pair of local input/output lines in an active mode may not exhibit a satisfactory operation quality both under a short /RAS to /CAS delay time (hereinafter, referred to as a tRCD) condition and under a long tRCD condition. In other words, the precharging circuit may exhibit a satisfactory operation quality either under the short tRCD condition or the long tRCD condition. If the precharging circuit does not exhibit a satisfactory operation quality under the short tRCD condition, a bit line disturbance phenomenon may occur, and if the precharging circuit does not exhibit a satisfactory operation quality under the long tRCD condition, a low-voltage high-speed operation quality may be degraded.

For this reason, a technique for realizing a low-voltage high-speed operation while reducing or minimizing bit line disturbance is required to vary a precharging scheme in accordance with an operation mode to precharge local input/output lines in a read data path circuit of a DRAM which applies data read from memory cells to output buffers in a read operation.

SUMMARY

Example embodiments provide a semiconductor memory device capable of performing a precharging operation on local input/output lines both under a short tRCD condition and under a long tRCD condition. The semiconductor memory device may include a read data path circuit to perform a read operation at a lower voltage at a higher speed and to reduce or minimize bit line disturbance.

Example embodiments provide a local input/output line precharging scheme for a high-speed semiconductor memory device, which makes it possible to perform a read operation with a lower-voltage at a higher speed and to reduce or minimize bit line disturbance.

Example embodiments provide a local input/output line precharging circuit which performs NMOS charging under a short tRCD condition and PMOS precharging under a long tRCD.

Example embodiments provide a DRAM capable of flexibly controlling a design margin for local input/output line sense amplifiers.

According to an example embodiment, a read data path circuit of a semiconductor memory device may include a bit line sense amplifier, a local input/output line sense amplifier, a column selecting unit configured to operationally connect bit lines connected to the bit line sense amplifier to local input/output lines connected to the local input/output line sense amplifier in response to a column selection signal and a local input/output line precharging unit.

The local input/output line precharging unit may be configured to precharge the pair of local input/output lines by a first conductive type precharging unit, to equalize the pair of local input/output lines by a second conductive type equalizing unit, and to precharge the pair of local input/output lines by a second conductive type precharging unit following an elapsed time after the bit line sense amplifier is activated, while the column selection is deactivated.

In the read data path circuit having the above-mentioned configuration, the first conductive type precharging unit of the local input/output line precharging unit may include two NMOS transistors, and the second conductive type equalizing unit of the local input/output line precharging unit may include one PMOS transistor. Moreover, the second conductive type precharging unit of the local input/output line precharging unit may include two PMOS transistors.

According to another example embodiment, a semiconductor memory device may include a memory cell array including a plurality of memory cells arranged in a matrix, each of the plurality of memory cells may include one access transistor and one storage capacitor, a plurality of bit line sense amplifiers may be connected to corresponding bit lines connected to the plurality of memory cells, a plurality of local input/output line sense amplifiers may each be connected to a corresponding global input/output line sense amplifier through corresponding global input/output lines, a plurality of column selecting units each of which may be configured to operationally connect corresponding bit lines to a corresponding pair of local input/output lines connected to a corresponding local input/output line sense amplifier, in response to a column selection signal and a plurality of local input/output line precharging units.

Each of the local input/output line precharging units may be configured to precharge corresponding local input/output lines by a first conductive type precharging unit, to equalize the corresponding local input/output lines by a second conductive type equalizing unit, and to precharge the corresponding pair of local input/output lines by a second conductive type precharging unit following an elapsed time after a corresponding bit line sense amplifier is activated, while the column selection signal input to a corresponding column selecting unit is deactivated.

In the semiconductor memory device having the above-mentioned configuration, when the first conductive type precharging unit includes NMOS transistors, the second conductive type precharging unit may include PMOS transistors.

The semiconductor memory device may further include a plurality of half source voltage precharging/equalizing units configured to precharge corresponding local input/output lines to a voltage equal to half of a source voltage until a corresponding word line is activated.

Each of the half source voltage precharging/equalizing units may include NMOS transistors.

According to an example embodiment, a read data path circuit of a semiconductor memory device may include a bit line sense amplifier, a local input/output line sense amplifier, a column selecting unit may be configured to operationally connect bit lines connected to the bit line sense amplifier to local input/output lines connected to the local input/output line sense amplifier, in response to a column selection signal and a local input/output line precharging unit.

The local input/output precharging unit may be configured to precharge the local input/output lines by NMOS transistors, to equalize the local input/output lines by a PMOS transistor, and to precharge the local input/output lines by PMOS transistors after an elapsed time after the bit line sense amplifier is activated, in response to an active command while the column selection signal is deactivated.

In the read data path circuit having the above-mentioned configuration, the local input/output line precharging unit may include a delay unit delaying a bit line sense amplifier enable signal for a set time; and a NAND gate performing a NAND operation on an output of the delay unit and an equalization enable signal of the PMOS transistor for equalizing, to produce a NAND response in order to activate the second conductive type precharging unit.

According to example embodiments, bit line disturbance may be minimized or reduced and a read operation is performed at a lower voltage and at a higher speed. Moreover, the NMOS precharging may be performed under the short tRCD condition and the PMOS precharging is performed under the long tRCD condition. Therefore, the example embodiments may be robust against bit line disturbance and are advantageous for a low-voltage high-speed operation.

BRIEF DESCRIPTION OF THE DRAWINGS

Example embodiments will be more clearly understood from the following brief description taken in conjunction with the accompanying drawings. FIGS. 1-9 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feat.

DETAILED DESCRIPTION OF EXAMPLE EMBODIMENTS

Example embodiments will now be described more fully with reference to the accompanying drawings. In the drawings, the thicknesses of layers and regions may be exaggerated for clarity.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second and third may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
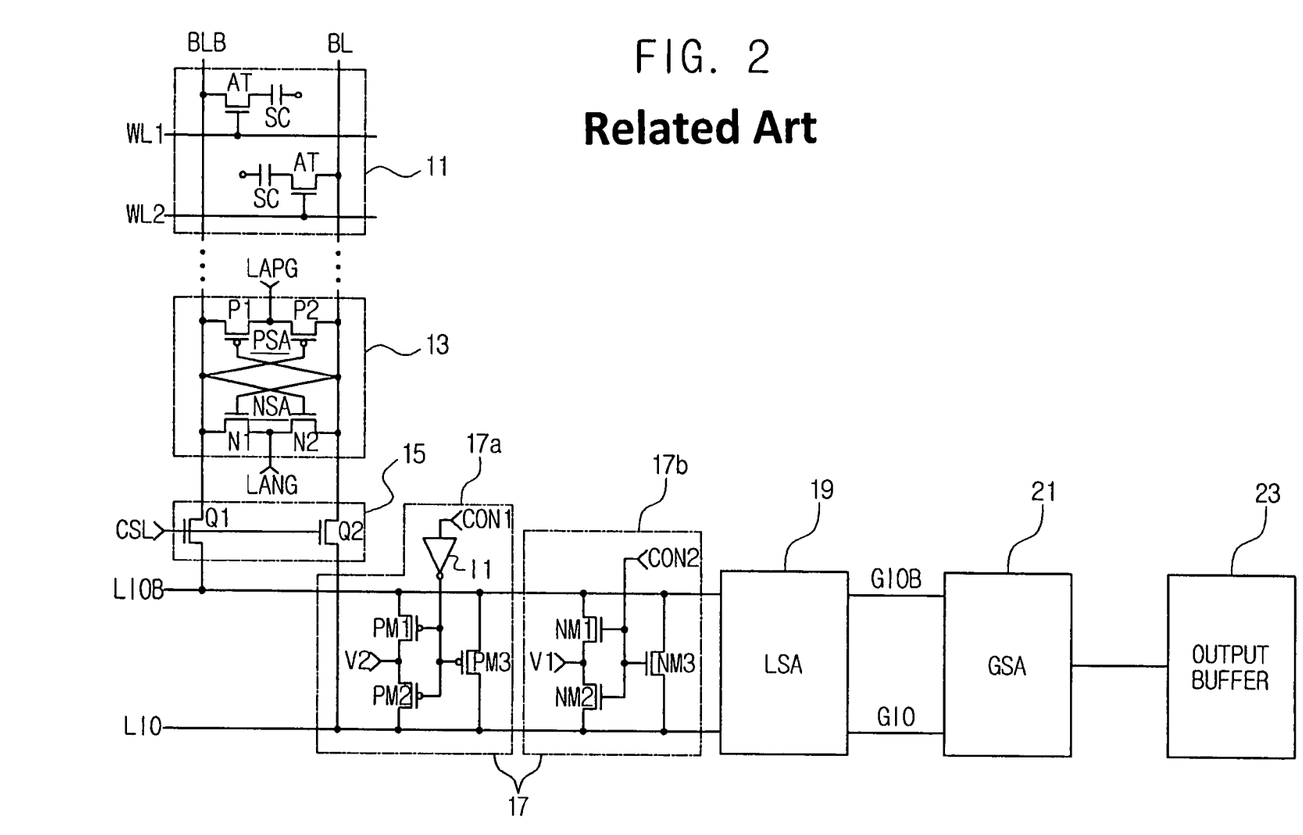
FIG. 2 is a diagram illustrating a read data path circuit using a local input/output line precharging scheme according to the related art.

FIG. 2 is a diagram illustrating a read data path circuit using a local input/output line precharging scheme according to the related art. In describing FIG. 2, plurality of will be used in it's broadest sense and may include one, one or more, or many elements.

Referring to FIG. 2, a read data path circuit of a DRAM includes a memory cell array 11, a plurality of bit line sense amplifiers 13, a plurality of column selecting units 15, a plurality of local input/output line precharging/equalizing units 17, a plurality of local input/output line sense amplifiers 19, a plurality of global input/output line sense amplifiers 21, and a plurality of output buffers 23.

The memory cell array 11 includes a plurality of memory cells which each have one access transistor AT and one storage capacitor SC. Word lines (e.g., word lines WL1 and WL2) may be connected to gates of access transistors AT of corresponding memory cells. Bit lines BL may be paired with complementary bit lines BLB, and the pairs of bit lines may be connected to drain/sources of corresponding access transistors AT. Each pair of bit lines may be connected to a corresponding bit line sense amplifier 13.

The bit line sense amplifier may include a PMOS sense amplifier PSA having PMOS transistors P1 and P2. The PMOS sense amplifier PSA may have an enable signal LAPG. The bit line sense amplifier may include a NMOS sense amplifier NSA having NMOS transistors N1 and N2. The NMOS sense amplifier NSA may have an enable signal LANG.

In a read operation, data stored in selected memory cells may appear as a potential difference on a corresponding pair of bit lines which may be sensed and amplified by a corresponding bit line sense amplifier 13.

Each column selecting unit 15 may include column selecting transistors Q1 and Q2 that may operationally connect a pair of bit lines BL and BLB to a pair of local input/output lines LIO and LIOB connected to a corresponding local input/output line sense amplifier 19, in response to a column selection signal CSL. Accordingly, in a read operation, sensed and amplified data on the pair of bit lines may be transmitted to the pair of local input/output lines LIO and LIOB.

Before a word line is activated to perform a read or write operation on selected memory cells, a half source voltage precharging/equalizing unit 17b may precharge a pair of local input/output lines LIO and LIOB corresponding to the selected memory cells to a first voltage corresponding to the precharge voltage for bit lines or half of a source voltage. To this end, a high-level control signal CON2 may be applied to gates of NMOS transistors NM1, NM2, and NM3 of the half source voltage precharging/equalizing unit 17b and a voltage V1 equal to the precharge voltage VBL for bit lines, for example, half of the source voltage may be applied to a common drain node of the NMOS transistors NM1 and NM2.

A local input/output line precharging unit 17a of the local input/output line precharging/equalizing unit 17 may precharge the pair of local input/output lines LIO and LIOB to a second voltage equal to an operation voltage of the memory cell array during a period when a word line is in an active state and a column selection signal CSL is in an inactive state in an active mode.

A control signal CON1 having a high level may be applied to gates of PMOS transistors PM1, PM2, and PM3 of the local input/output line precharging unit 17a when the word line is in an active state, and a voltage V2 equal to the operation voltage of the memory cell array may be applied to a common source node of the PMOS transistors PM1 and PM2. The PMOS transistors PM1 and PM2 may be involved in a precharging operation and the PMOS transistor PM3 may be involved in an equalizing operation.

In a read operation, the local input/output line sense amplifier 19 may sense read data having been transmitted from the memory cells onto the pair of local input/output lines LIO and LIOB, may amplify the read data, and may output the read data to a pair of global input/output lines GIO and GIOB. The global input/output line sense amplifier 21 may sense the read data on the pair of global input/output lines GIO and GIOB, and may amplify the read data, and may output the read data to an output buffer 23.

In the read data path circuit as shown in FIG. 2, a precharging/equalizing operation by the PMOS transistors of the local input/output line precharging unit 17a may cause bit line disturbance.

If a precharging/equalizing operation by the PMOS transistors PM1, PM2, and PM3 is performed to make the pair of local input/output lines have the second voltage equal to the operation voltage of the memory cell array, if the column selection signal CSL is enabled under a short tRCD condition in which the bit line sense amplifier 13 have not yet sufficiently developed the pair of local input/output lines, a bit line disturbance phenomenon may occur.

For example, when a state in which there is no charge stored in a memory cell is defined as logical data "0" and a state in which there is charge stored in a memory cell is defined as logical data "1", if logical data of a selected memory cell is "0", an electric potential of a bit line BL of a pair of bit lines, which is lower than an electric potential of a corresponding complementary bit line BLB, is sensed and amplified by a bit line sense amplifier 13, and is transmitted to a local input/output line LIO of a pair of local input/output lines LIO and LIOB through a column selecting transistor Q2 of the column selecting unit 15. During an early period of a sensing operation of the local input/output line sense amplifier 19 after the column selection signal CSL is activated, an electric potential difference between the pair of bit lines BL and BLB may not be sufficient.

Therefore, electric charge precharged on the local input/output line LIO may raise the electric potential of the bit line BL through the column selecting transistor Q2. If the electric potential of the bit line BL rises, the electric potential difference between the pair of bit lines BL and BLB decreases. This phenomenon is referred to as bit line disturbance.

If a mismatch of the bit line sense amplifiers occurs during an early period of a sensing operation, the bit line disturbance phenomenon in which electric charge on one of a pair of local input/output lines is transferred to one of a pair of bit lines having a lower electric potential may cause reverse sensing.

Figure 3:
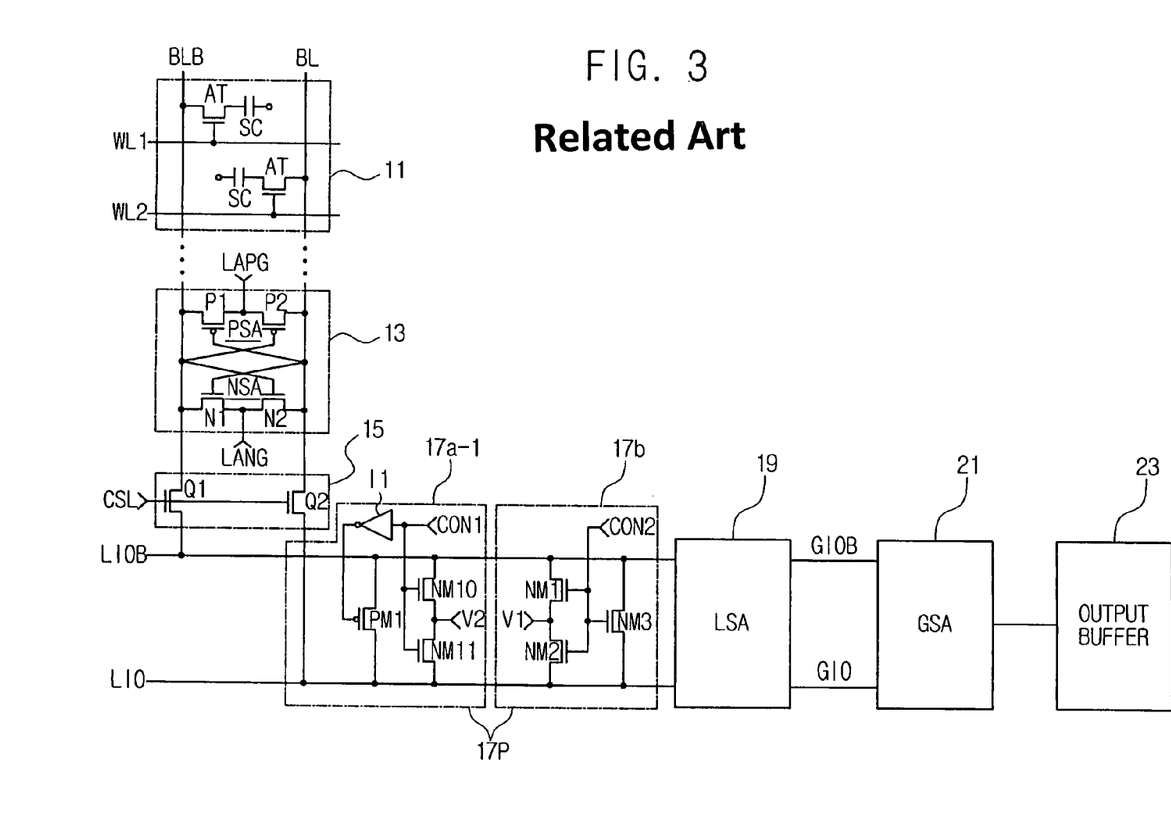
FIG. 3 is a diagram illustrating a read data path circuit using a local input/output line precharging scheme according to the related art.
Figure 4:
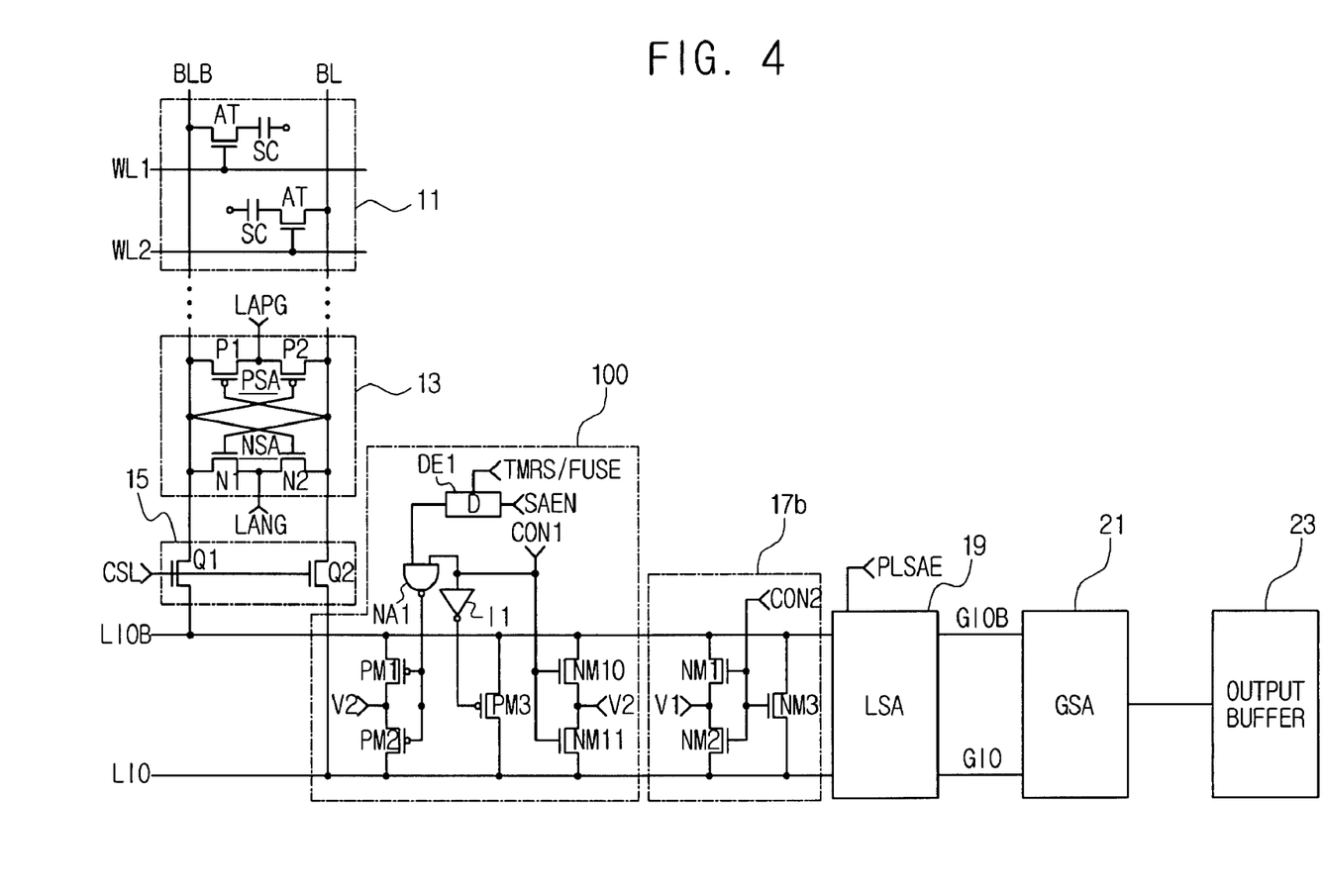
FIG. 4 is a diagram illustrating a read data path circuit using a local input/output line precharging scheme according to an example embodiment.

Degradation in a low-voltage high-speed operation quality due to a precharging operation of NMOS transistors NM10 and NM11 and an equalizing operation of a PMOS transistor PM1 in a local input/output line precharging unit 17a-1 will be described with reference to FIG. 3. FIG. 3 and FIG. 4 contain like elements to FIG. 1. Only elements having differing features will be described further with regards to FIG. 3 and FIG. 4.

A precharging operation of the NMOS transistors NM10 and NM11 and an equalizing operation of the PMOS transistor PM1 may make a local input/output line LIO have a voltage which is equal to a voltage obtained by subtracting a threshold voltage Vth of the NMOS transistors NM10 and NM11 from an operation voltage of a memory cell array. Therefore, the circuit of FIG. 3 may exhibit an improved quality under a short tRCD condition, as compared to the circuit of FIG. 2. However, in a low-voltage high-speed operation, a deterioration in an equalizing quality may occur due to a drop in a gate-to-source voltage of the PMOS transistor PM1.

In order to prevent or minimize bit line disturbance and to prevent or minimize a deterioration in a low-voltage high-speed operation quality, an example embodiment provides a local input/output line precharging unit 100 as shown in FIG. 4.

Referring to FIG. 4, if a column selection signal CSL is in an inactive state, the local input/output line precharging unit 100 may primarily precharge a pair of local input/output lines LIO and LIOB by NMOS transistors NM10 and NM11 and perform an equalizing operation by a PMOS transistor PM3. If a set time elapses after a bit line sense amplifier 13 is activated, the local input/output line precharging unit 100 may secondarily precharge the pair of local input/output lines LIO and LIOB by PMOS transistors PM1 and PM2.

The local input/output line precharging unit 100 may include a delay unit DE1, a NAND gate NA1, and an inverter I1. The delay unit DE1 may receive a bit line sense amplifier enable signal SAEN and delays the bit line sense amplifier enable signal SAEN for a set time. The NAND gate NA1 may perform a NAND operation on the bit line sense amplifier enable signal SAEN from the delay unit DE1 and a high-level control signal CON1 applied if a word line is in an active state and the column selection signal is in an inactive state in an active mode, thereby producing a NAND response. The inverter I1 may invert the control signal CON1 and may apply the control signal CON1 to a gate terminal of the PMOS transistor PM3.

The local input/output line precharging unit 100 of FIG. 4 may perform NMOS precharging under a short tRCD condition and performs PMOS precharging under a long tRCD condition. Therefore, the local input/output line precharging unit 100 may be robust against bit line disturbance and advantageous for a low-voltage high-speed operation.

FIG. 4 is a diagram illustrating a read data path circuit using a local input/output line precharging scheme according to an example embodiment.

Figure 5:
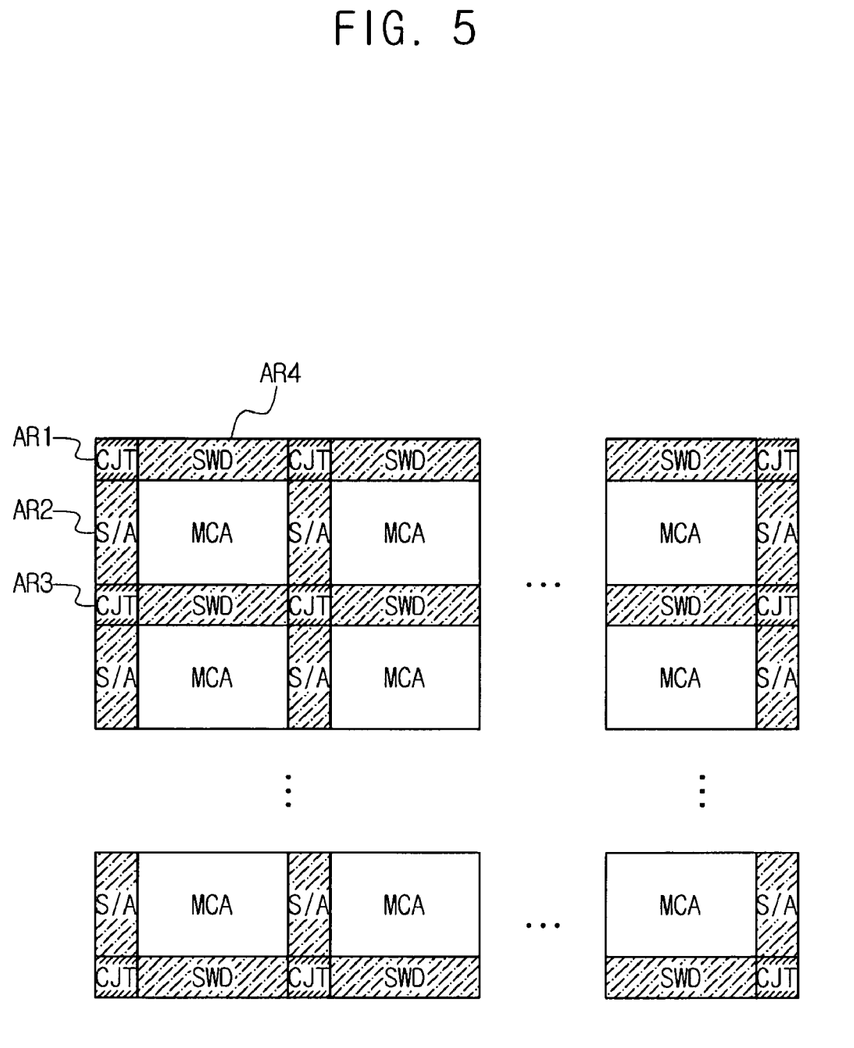
FIG. 5 is a diagram illustrating conjunction areas of a semiconductor memory device where some of circuit elements of FIG. 4 are located.
Figure 6:
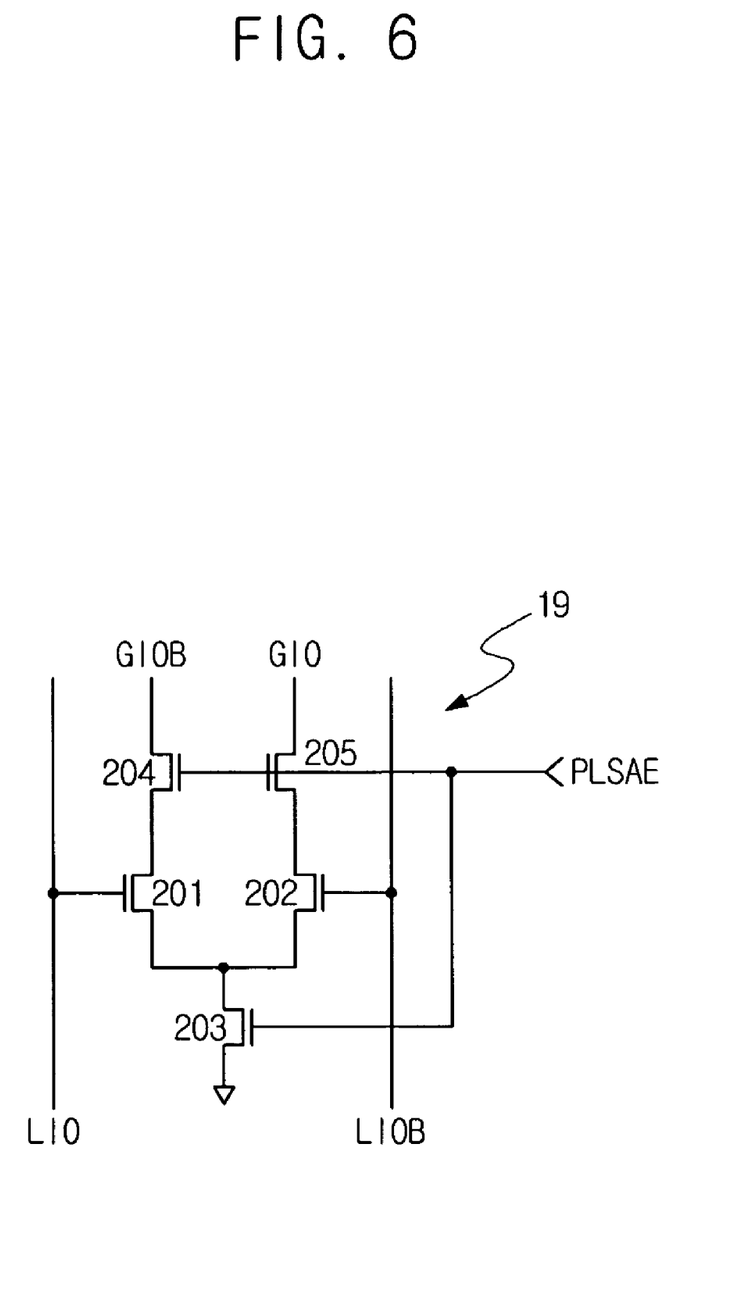
FIG. 6 is a diagram illustrating an example configuration of a local input/output line sense amplifier of FIG. 4.
Figure 7:
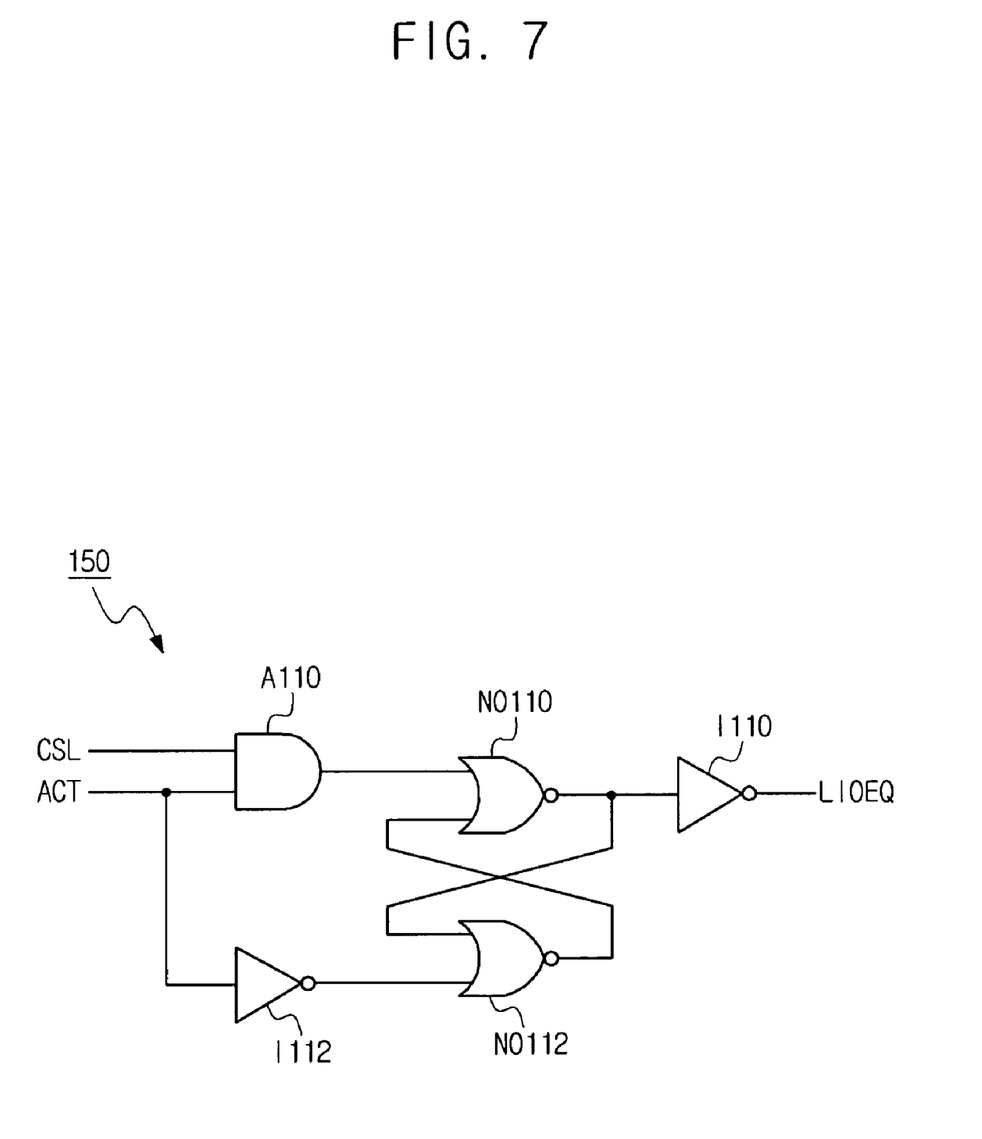
FIG. 7 is a diagram illustrating an example configuration of an equalization signal generating unit involved in a local input/output line equalizing operation of the circuit of FIG. 4.

FIG. 5 is a diagram illustrating conjunction areas of a semiconductor memory device where some circuit elements of FIG. 4 are located. FIG. 6 is a diagram illustrating an example configuration of a local input/output line sense amplifier of FIG. 4. FIG. 7 is a diagram illustrating an example configuration of an equalization signal generating unit involved in a local input/output line equalizing operation of the circuit of FIG. 4.

Figure 8:
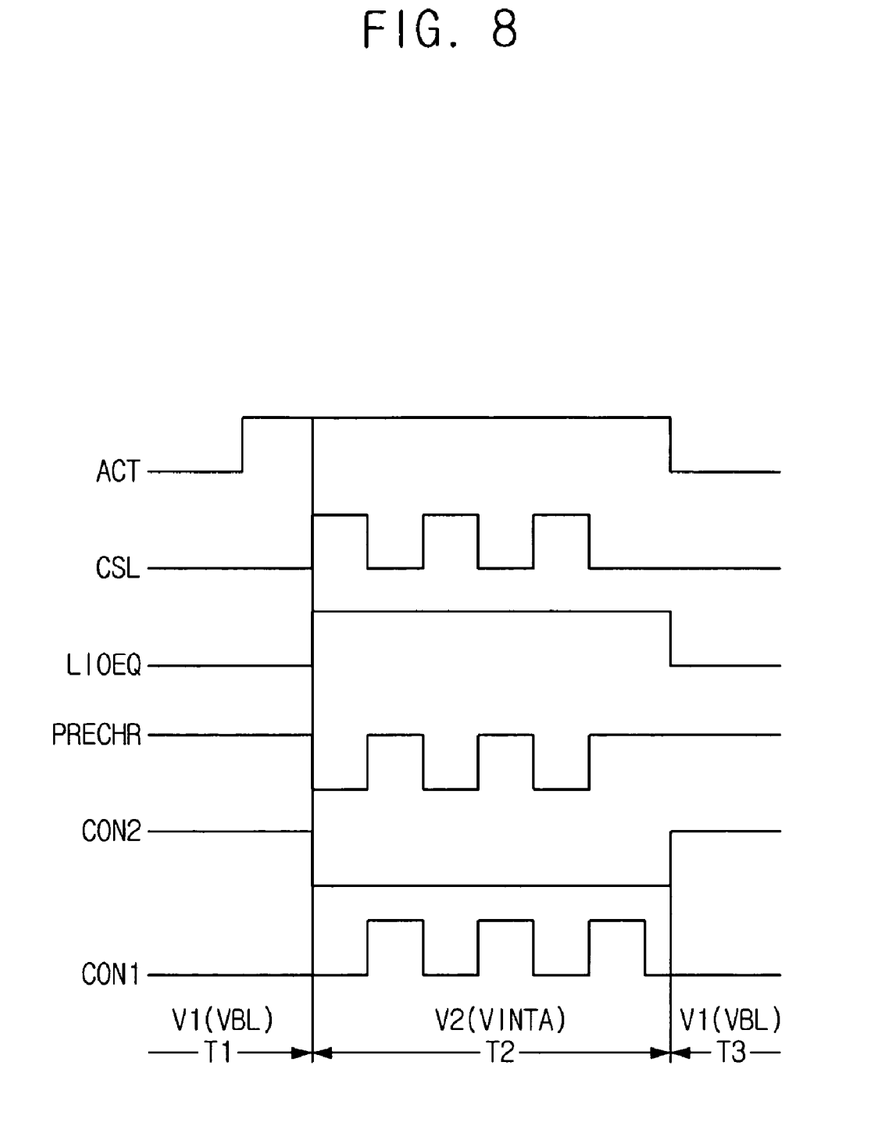
FIG. 8 is a timing chart illustrating a local input/output line precharging operation of the circuit of FIG. 4.
Figure 9:
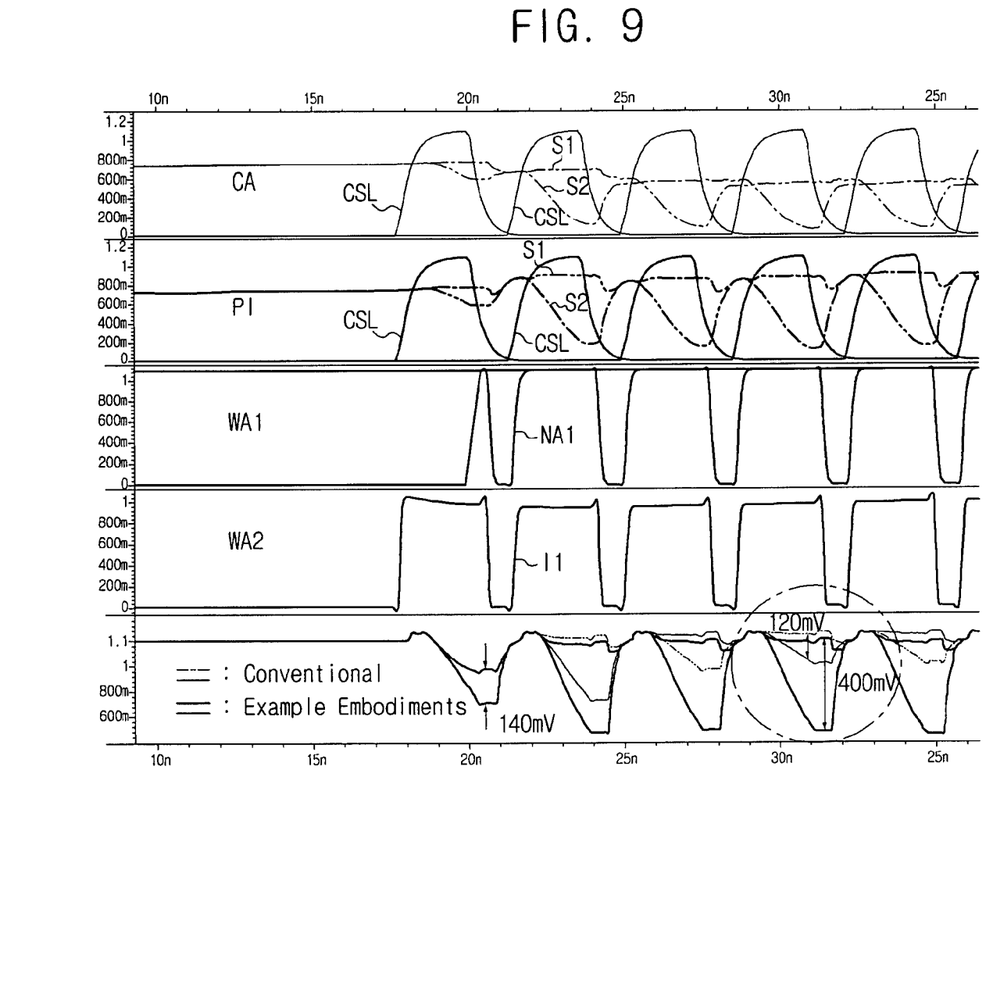
FIG. 9 is a waveform chart illustrating simulation results for comparing a case of using the local input/output line precharging unit shown in FIG. 4 as compared to using a local input/output line precharging unit according to the related art.

FIG. 8 is a timing chart illustrating a local input/output line precharging operation of the circuit of FIG. 4. FIG. 9 is a waveform chart illustrating simulation results comparing using the local input/output line precharging unit shown in FIG. 4 and using a local input/output line precharging unit according to the related art.

Referring to FIG. 4, a memory cell array 11, a bit line sense amplifier 13, a column selecting unit 15, a half source voltage precharging/equalizing unit 17b, a local input/output line sense amplifier 19, a global input/output line sense amplifier 21, and an output buffer 23 may have the same configurations as those in FIGS. 2 and 3.

A word line is activated to perform a read or write operation on memory cells, the half source voltage precharging/equalizing unit 17b precharges a pair of local input/output lines LIO and LIOB to a voltage corresponding to the precharge voltage VBL for bit lines or half of a source voltage. When the word line is in an inactive state, a high-level control signal CON2 may be applied to gates of NMOS transistors NM1, NM2, and NM3 of the half source voltage precharging/equalizing unit 17b and a voltage V1 equal to the precharge voltage VBL for bit lines or half of the source voltage may be applied to a common drain node of the NMOS transistors NM1 and NM2. Such a precharging operation is performed during periods T1 and T3 of FIG. 8.

Referring to FIG. 8, in the period T1, the control signal CON2 may have the high level and the control signal CON1 may have the low level. Further, the column selection signal CSL may maintain an inactive state.

If the period T1 ends, in order to read data from memory cells, an active mode in which a word line WL connected to the memory cells may be activated.

In FIG. 8, if an active mode signal ACT is at a high level, the column selection signal CSL may be periodically transitioned between the high level and the low level as shown in FIGS. 8 and 9, the control signal CON2 may have a low level, and the control signal CON1 may be periodically transitioned between a high level and a low level to have a level opposite to the level of the column selection signal CSL. An equalization signal generating circuit 150 of FIG. 7 may generate a local input/output line equalization signal LIOEQ having a waveform as shown in FIG. 8. In the period T2, a precharging operation may be performed to precharge the pair of local input/output lines to a voltage equal to the operation voltage VINTA of the memory cell array.

If a word line is in an active state and the column selection signal CSL is in an inactive state, the local input/output line precharging unit 100 may precharge the pair of local input/output lines LIO and LIOB to a voltage equal to the operation voltage of the memory cell array over two stages.

The local input/output line precharging unit 100 may primarily precharge the pair of local input/output lines LIO and LIOB by NMOS transistors NM10 and NM11 and equalizes the pair of local input/output lines LIO and LIOB by a PMOS transistor PM3. When a set time elapses after the bit line sense amplifier 13 is activated, the local input/output line precharging unit 100 may secondarily precharge the pair of local input/output lines LIO and LIOB by PMOS transistors PM1 and PM2.

As described above, under a short tRCD condition, NMOS precharging may be performed to make the pair of local input/output lines LIO and LIOB have a voltage equal to a voltage obtained by subtracting a threshold voltage Vth of the NMOS transistors NM10 and NM11 from an operation voltage of a memory cell array, and under a long tRCD condition, PMOS charging may be performed to make the pair of local input/output lines LIO and LIOB have a voltage equal to the operation voltage of the memory cell array. Accordingly, the read data path circuit may be robust against bit line disturbance and advantageous for a low-voltage high-speed operation.

The operation to precharge the pair of local input/output lines LIO and LIOB to the voltage equal to the operation voltage of the memory cell array may continue until the word line is disabled to finish the active mode. The precharging operation on the pair of local input/output lines LIO and LIOB may be interrupted when data is transmitted to the pair of local input/output lines LIO and LIOB through a pair of bit lines BL and BLB. If a column address strobe signal is applied and the column selection signal CSL is enabled, column selecting transistors Q1 and Q2 may be turned on to connect the pair of bit lines BL and BLB to the pair of local input/output lines LIO and LIOB.

If the column selecting transistors Q1 and Q2 are in an ON state, a precharging operation on the pair of local input/output lines LIO and LIOB may not be performed. A voltage corresponding to data may be supplied to the pair of local input/output lines LIO and LIOB and a precharge enable signal PRECHR may be disabled as shown in FIG. 8. If the active mode finishes and the period T3 starts, the pair of local input/output lines LIO and LIOB may be precharged to a voltage equal to the precharge voltage for the bit lines.

As shown in FIG. 7, the equalization signal generating unit 150 may generate the local input/output line equalization signal LIOEQ on the basis of a combination of the active mode signal ACT and the column selection signal CSL. The term "active mode" may define an operation mode from when a word line WL connected to selected memory cells is enabled to when the word line WL is disabled. Accordingly, the term "active mode signal" may define a word line enable signal WL.

The equalization signal generating unit 150 may include an AND gate A110, NOR gates NO110 and NO112, and inverters I110 and I112 which may be connected as shown in FIG. 7. The equalization signal generating unit 150 may generate the local input/output line equalization signal LIOEQ having an enable period (the period T2 in FIG. 8) from when the column selection signal CSL is enabled for the first time in the active mode to when the active mode finishes.

The inverter I11 of FIG. 4 may be within conjunction areas AR1 and AR3 shown in FIG. 5, and the delay unit DE1 may be within a peripheral area of the whole area of FIG. 5.

FIG. 5 illustrates conjunction areas of a semiconductor memory device where the inverter I1 of FIG. 4 may be located. In FIG. 5, sub word line driver areas AR4 and bit line sense amplifier areas AR2 may be around memory cell blocks of a memory cell array MCA and the conjunction areas AR1 and AR3 may be at intersections of the sub word line driver SWD areas AR4 and the bit line sense amplifier areas AR2. Drivers such as the inverter I1 may be in the conjunction areas AR1 and AR3.

In some example embodiments, the inverter may be designed in the conjunction area AR1 and AR3 and the delay unit and various trimming circuits for controlling an amount of delay of the delay unit may be designed in the peripheral area, resulting in a sufficient layout margin. Trimming is achieved by applying a test mode register set signal or a fuse option.

FIG. 6 illustrates an example configuration of the local input/output line sense amplifier 19 of FIG. 4. Referring to FIG. 6, the local input/output line sense amplifier 19 may include NMOS transistors 201 to 205. A sense amplifier enable signal PLSAE may be input to the local input/output line sense amplifier 19. If the sense amplifier enable signal PLSAE is transitioned to a high level, the local input/output line sense amplifier 19 may be activated, senses and amplifies data appearing on the pair of local input/output lines LIO and LIOB, and transmits the data to a pair of global input/output lines GIO and GIOB.

FIG. 9 is a waveform chart illustrating the results of a simulation for comparing using the local input/output line precharging unit shown in FIG. 4 and using a local input/output line precharging unit according to the related art.

The simulation was performed on the assumption that a source voltage is 1.1 V and a DDR clock frequency is 2133 Mbps. In FIG. 9, a horizontal axis represents time in nanoseconds and a vertical axis represents voltage in volts.

The first graph CA from the top of FIG. 9 represents electric potential development between a pair of local input/output lines when NMOS precharging is performed according to the related art. Reference symbols S1 and S2 represent profiles of precharge voltages of the pair of local input/output lines during a period when the column selection signal CSL is in an inactive state. The profiles S1 and S2 that the levels of the profiles S1 and S2 are lowered as time elapses, for example, as the tRCD gets longer, and the pair of local input/output lines are not satisfactorily equalized.

The second graph PI from the top of FIG. 9 may represent electric potential development between a pair of local input/output lines if precharging is performed according to the exemplary embodiment of FIG. 4. The profiles S1 and S2 of precharge voltages of the pair of local input/output lines that the levels of the profiles are not lowered over time and the pair of local input/output lines may be satisfactorily equalized.

The third and fourth graphs WA1 and WA2 from the top of FIG. 9 represent outputs of the NAND gate NA1 and the inverter I1 of FIG. 4.

The fifth graph from the top of FIG. 9 may represent a sensing margin of the circuit of FIG. 4 and a sensing margin of the circuit of FIG. 2. In the circuit of FIG. 2 according to the related art, the sensing margin at input terminals of the global input/output line sense amplifier 21 is 120 mV, and the circuit of FIG. 4 according to the example embodiment, the sensing margin at input terminals of the global input/output line sense amplifier 21 is 400 mV. The sensing margin according to the example embodiment may be improved as compared to that according to the related art. As described above, example embodiments may have noticeable effects as compared to the related art.

The five consecutive pulses of the fifth graph of the FIG. 9 represents a burst read operation.

In the drawings and specification, there have been disclosed embodiments of the invention and, although specific terms are employed, they are used in a generic and descriptive sense only and not for limitation. While the inventive concepts have been particularly shown and described with reference to exemplary embodiments, it will be understood that various changes in form and details may be made therein without departing from the spirit and scope of the invention, as described by the following claims. For example, the delay of the delay unit, the internal connection of the precharging unit, and others can be changed. Moreover, exemplary embodiment of the invention is applicable to volatile memories such as pseudo SRAMs as well as DRAMs.

While example embodiments have been particularly shown and described, it will be understood by one of ordinary skill in the art that variations in form and detail may be made therein without departing from the spirit and scope of the claims.

What is claimed is:

1. A read data path circuit of a semiconductor memory device, the circuit comprising:
   a first sense amplifier; and
   a precharging unit including a first conductive type precharging unit, a second conductive type precharging unit, a delay unit, a NAND gate, and an equalizing unit,
   the first conductive type precharging unit configured to precharge input/output lines that correspond with a second sense amplifier,
   the equalizing unit configured to equalize a voltage of the input/output lines of the circuit,
   the second conductive type precharging unit configured to precharge the input/output lines following an elapsed time after the first sense amplifier is activated and while a column selection unit is deactivated, the column selecting unit configured to operationally connect bit lines corresponding with the first sense amplifier to the input/output lines in response to a selection signal,
   the delay unit configured to delay an enable signal to the second sense amplifier, and
   the NAND gate performing a NAND operation on an output of the delay unit and an equalization enable signal of the equalizing unit, to produce a NAND response in order to activate the second conductive type precharging unit.

2. The read data path circuit of claim 1, wherein the first conductive type precharging unit includes two NMOS transistors.

3. The read data path circuit of claim 2, wherein the equalizing unit includes one PMOS transistor.

4. The read data path circuit of claim 3, wherein the second conductive type precharging unit includes two PMOS transistors.

5. The read data path circuit of claim 2, wherein at least one of the first conductive type precharging unit and the second conductive type precharging unit precharges the input/output lines to a voltage equal to an operation voltage of the semiconductor memory device minus a threshold voltage of the two NMOS transistors.

6. The read data path circuit of claim 1, further comprising:
   a half source voltage precharging/equalizing unit configured to precharge the input/output lines to a voltage equal to half of a source voltage until a word line is activated.

7. The read data path circuit of claim 6, wherein the half source voltage precharging/equalizing unit includes NMOS transistors.

8. The read data path circuit of claim 1, wherein at least one of the first conductive type precharging unit and the second conductive type precharging unit precharges the input/output lines to a voltage equal to an operation voltage of the semiconductor memory device.

9. A semiconductor memory device comprising:
   a memory cell array including a plurality of memory cells arranged in a matrix, each of the plurality of memory cells including at least one access transistor and one storage capacitor;
   a plurality of first sense amplifiers electrically connected to corresponding bit lines electrically connected to the plurality of memory cells;
   a plurality of precharging units each of which includes a first conductive type precharging unit, a second conductive type precharging unit, an equalizing unit, a delay unit and a NAND gate,
   the first conductive type precharging unit configured to precharge first input/output lines,
   the equalizing unit configured to equalize a voltage of the first input/output lines,
   the second conductive type precharging unit configured to precharge the first input/output lines following an elapsed time after an associated first sense amplifier of the plurality of first sense amplifiers is activated and while an associated column selecting unit of a plurality of column selecting units is deactivated,
   the delay unit configured to delay an enable signal to a corresponding sense amplifier of a plurality of second sense amplifiers,
   the NAND gate performing a NAND operation on an output of the delay unit and an equalization enable signal of the equalizing unit, to produce a NAND response in order to activate the second conductive type precharging unit.

10. The semiconductor memory device of claim 9, wherein,
   each of the plurality of column selecting units is configured to operationally connect the bit lines to the first input/output lines in response to a selection signal, and second input/output lines electrically connect one of a the corresponding plurality of second sense amplifiers to a third sense amplifier.

11. The semiconductor memory device of claim 9, wherein, if the first conductive type precharging unit includes NMOS transistors, the second conductive type precharging unit includes PMOS transistors.

12. The semiconductor memory device of claim 11, further comprising:
a plurality of half source voltage precharging/equalizing units configured to precharge the input/output lines to a voltage equal to half of a source voltage until a corresponding word line is activated.

13. The semiconductor memory device of claim 12, wherein each of the plurality of half source voltage precharging/equalizing units include NMOS transistors.

14. The semiconductor memory device of claim 9, wherein the plurality of precharging units precharge the input/output lines to a voltage equal to an operation voltage of the memory cell array.

15. A read data path circuit of a semiconductor memory device, the circuit comprising:
a first sense amplifier;
a second sense amplifier;
a column selecting unit configured to operationally connect bit lines corresponding to the first sense amplifier to input/output lines corresponding to the second sense amplifier, in response to a selection signal;
a precharging unit configured to precharge the input/output lines by NMOS transistors, the precharging unit configured to equalize a voltage of the input/output lines by a PMOS transistor, and the precharging unit configured to precharge the input/output lines by PMOS transistors following an elapsed time after the first sense amplifier is activated and the selection signal is deactivated, the precharging unit including
a delay unit configured to delay an enable signal to the second sense amplifier; and
a NAND gate performing a NAND operation on an output of the delay unit and an equalization enable signal of the PMOS transistor for equalizing, to produce a NAND response in order to activate the second conductive type precharging unit.

16. The read data path circuit of claim 15, further comprising:
a half source voltage precharging/equalizing unit configured to precharge the input/output lines to half of a source voltage until a word line is activated.

* * * * *